(12) United States Patent
Jerebic et al.

(10) Patent No.: US 12,080,834 B2
(45) Date of Patent: Sep. 3, 2024

(54) OPTOELECTRONIC LIGHTING DEVICE, OPTOELECTRONIC ILLUMINATION DEVICE AND METHOD OF MANUFACTURING

(71) Applicant: OSRAM OLED GmbH, Regensburg (DE)

(72) Inventors: Simon Jerebic, Donaustauf (DE); Daniel Leisen, Regensburg (DE); Philipp Pust, Langquaid (DE); Thomas Birke, Wenzenbach (DE)

(73) Assignee: OSRAM OLED GmbH, Regensburg (DE)

( * ) Notice: Subject to any disclaimer, the term of this patent is extended or adjusted under 35 U.S.C. 154(b) by 682 days.

(21) Appl. No.: 17/270,761

(22) PCT Filed: Aug. 9, 2019

(86) PCT No.: PCT/EP2019/071475
§ 371 (c)(1),
(2) Date: Feb. 23, 2021

(87) PCT Pub. No.: WO2020/043467
PCT Pub. Date: Mar. 5, 2020

(65) Prior Publication Data
US 2021/0280751 A1 Sep. 9, 2021

(30) Foreign Application Priority Data
Aug. 31, 2018 (DE) .......................... 102018121338.7

(51) Int. Cl.
*H01L 33/50* (2010.01)
*H01L 25/075* (2006.01)
(Continued)

(52) U.S. Cl.
CPC ........ *H01L 33/505* (2013.01); *H01L 25/0753* (2013.01); *H01L 33/24* (2013.01); *H01L 33/60* (2013.01); *H01L 2933/0041* (2013.01)

(58) Field of Classification Search
CPC ... H01L 33/505; H01L 25/0753; H01L 33/24; H01L 33/60; H01L 2933/0041;
(Continued)

(56) References Cited

U.S. PATENT DOCUMENTS 9,608,182 B2 3/2017 Ukawa
10,103,296 B2 10/2018 Singer et al.
(Continued)

FOREIGN PATENT DOCUMENTS

DE 102012102114 A1 9/2013
DE 102014114372 A1 4/2016
(Continued)

*Primary Examiner* — Matthew L Reames
(74) *Attorney, Agent, or Firm* — Slater Matsil, LLP

(57) ABSTRACT

In an embodiment an optoelectronic lighting device includes a carrier, exactly one light-emitting optoelectronic semiconductor component, wherein the semiconductor component has a light emission area on at least one surface side, and wherein the semiconductor component is arranged on an upper side of the carrier, at least one functional layer arranged above the light emission area and/or adjacent to the light emission area and an edging for the functional layer, wherein the edging surrounds the functional layer when viewed in a circumferential direction, the circumferential direction being parallel to the upper side of the carrier around the functional layer, and wherein the edging is formed of a transparent material.

18 Claims, 5 Drawing Sheets

(51) Int. Cl.
*H01L 33/24* (2010.01)
*H01L 33/60* (2010.01)

(58) Field of Classification Search
CPC ............... H01L 33/0095; H01L 33/52; H01L 2933/005; H01L 33/502
See application file for complete search history.

(56) References Cited

U.S. PATENT DOCUMENTS

| | | |
|---|---|---|
| 10,153,408 B2 | 12/2018 | Abe et al. |
| 2011/0108851 A1 | 5/2011 | Chu et al. |
| 2012/0025167 A1 | 2/2012 | Chu et al. |
| 2015/0049510 A1 | 2/2015 | Haiberger et al. |
| 2017/0025572 A1 | 1/2017 | Shichijo et al. |

FOREIGN PATENT DOCUMENTS

| | | |
|---|---|---|
| DE | 102017119888 A1 | 3/2018 |
| EP | 2975655 A1 | 1/2016 |
| WO | 2015036887 A1 | 3/2015 |

OPTOELECTRONIC LIGHTING DEVICE, OPTOELECTRONIC ILLUMINATION DEVICE AND METHOD OF MANUFACTURING

This patent application is a national phase filing under section 371 of PCT/EP2019/071475, filed Aug. 9, 2019, which claims the priority of German patent application 10 2018 121 338.7, filed Aug. 31, 2018, each of which is incorporated herein by reference in its entirety.

TECHNICAL FIELD

The present invention relates to an optoelectronic lighting device, an optoelectronic illumination device and a method of manufacturing at least one optoelectronic lighting device or an optoelectronic illumination device.

BACKGROUND

German Patent Application DE 10 2012 102 114 A1 describes an optoelectronic lighting device whose emitted light can be used efficiently.

SUMMARY OF THE INVENTION

Embodiments provide an optoelectronic lighting device which can be manufactured in a simple manner and is insensitive to influences (such as humidity) of the environment.

An optoelectronic lighting device comprises:
  at least one light-emitting semiconductor component, in particular an LED (Light Emitting Diode) or an LED chip, the semiconductor component having a light emission area on at least one surface side,
  a carrier for the semiconductor component, the semiconductor component being arranged on an upper side of the carrier,
  at least one functional layer, in particular a conversion layer for converting light emerging from the emission area into light with at least one other wavelength, the functional layer being arranged above the emission area and/or next to the emission area, and
  an edging for the functional layer, the edging surrounding the functional layer when viewed in a circumferential direction, the circumferential direction being parallel to the upper side of the carrier around the functional layer, wherein the edging is formed of a transparent material.

The functional layer can be a conversion layer. The conversion layer can for example contain phosphor, for example phosphor, and in particular consist of a silicon-fluorescent mixture. More generally, the functional layer can be any layer that is arranged as a layer directly above the light-emitting semiconductor component.

In particular, the light-emitting semiconductor component can be a surface emitter whose light emission area is located on the top side of the light-emitting semiconductor component facing away from the carrier. The functional layer can be located directly above the light emission area and thus be in contact with the emission area.

The light-emitting semiconductor component may be a volume emitter with a light emission area on the top side facing away from the carrier. Alternatively or additionally, the light-emitting semiconductor component may have a light emission area on at least one side surface that is perpendicular to the upper side of the carrier. The functional layer can be arranged in the plane of the side surface and thus be provided next to the semiconductor component.

In the context of this disclosure, light is not only meant to be light in the visible wavelength range, but more generally any electromagnetic radiation that can be emitted by a light-emitting semiconductor component. In particular, the term light shall also refer to electromagnetic radiation in the infrared or ultraviolet wavelength range.

In particular, the optoelectronic lighting device can comprise exactly one light-emitting optoelectronic semiconductor component. A particularly compact design of the lighting device is therefore possible.

In the optoelectronic lighting device, the edging surrounds the functional layer as seen in circumferential direction. The edging thus forms a border surrounding the functional layer, by which the functional layer can be protected from environmental influences, for example from oxygen or moisture. Since a functional or conversion layer can contain phosphor, this phosphor can be protected against moisture and/or oxygen, for example, by the edging.

The edging can surround the functional layer in such a way that the functional layer is completely inside the edging when viewed in a direction parallel to the upper side of the carrier. In this way, the functional layer can be protected particularly well against influences acting on the optoelectronic lighting device from the side.

The edging can have a surrounding border in the circumferential direction, in the center of which a continuous opening is provided, wherein the edging is surrounding the functional layer in such a way that the center of the border lies above the emission area of the semiconductor component and the functional layer fills the opening at least partially and preferably completely. The formulation that the center of the border lies above the emission area of the semiconductor component is in particular to be understood as meaning that the center of the border, viewed along a straight line which runs perpendicular to the upper side of the carrier, lies above the center of the emission area of the optoelectronic semiconductor component or coincides with the center. In the case of a volume emitter with an emission area on at least one side surface, the geometric center of the volume emitter can also be meant as the center.

The border can thus form an outer edge area around the functional layer. Since the center of the border lies above the emission area of the semiconductor component, the functional layer, for example a conversion layer, is located above the emission area. The light from the optoelectronic semiconductor component can thus reach the functional layer. The light can pass from the functional layer further to the top side of the optoelectronic lighting device facing away from the carrier and be emitted outwards. The light can alternatively or additionally pass through the light-transparent border and be emitted outwards on at least one side surface of the lighting device.

The border of the edging may have at least one outer side, which lies on a side surface of the lighting device. The outer side of the border can thus form a part of the side surface of the lighting device. A single optoelectronic lighting device can be made of a continuous matrix-like arrangement of such optoelectronic lighting devices. When separating the optoelectronic lighting devices, the matrix-like optoelectronic lighting devices are separated from each other. This can be done by means of a cutting process, e.g. by means of a slicing process, whereby a cut is made in planes that are perpendicular to the upper side of the carrier. The side surfaces of the separated lighting devices then lie in separation planes. If the border of the edging is located on the lateral top side of the light device, this means that in the layer plane of the functional layer, no separation through the functional layer has taken place, but through the border of the edging. This has the advantage, for example, that during the cutting process the functional layer does not come into contact with a cutting tool and thus no areas or particles can be torn out of the functional layer or damaged. In the case of a conversion layer, for example, such damage could lead to aging problems with moisture-sensitive and/or surface-coated phosphors. Furthermore, such damage could create a very rough surface in a light emission area, which would have a negative effect on component efficiency.

According to a preferred further development, at least one outer side of a border of the edging does not lie on a side surface of the lighting device, but between the outer side and the side surface at least one edge layer, in particular of a molding material, is formed. The edge layer can be at least partially transparent. Thus the edging can be formed material-saving and economically and be set back to the rear in relation to the side surface.

The edging may have a refractive index that is between the refractive index of the conversion material and air. The extraction efficiency can thus be increased.

The edging can be made of a transparent material. The edging may consist of a material, which comprises or consists of silicone and/or glass.

The edging can be made of a material such as that used to form dams in electrical or optoelectronic components. The material can for example be a viscous, curing silicone, which can be applied by means of a dispenser.

The functional layer can be flat on its top side facing away from the upper side of the carrier or have a recess in the middle of the top side. The top side, which is recessed in the center, can be designed especially for reflector shaping. This allows light to be directed outwards to the side surfaces of the lighting device in an improved manner.

At least one additional layer can be provided above the top side of the functional layer. In particular, at least one layer arranged above the functional layer may comprise silicone and/or titanium dioxide (TiO2) and in particular may consist of silicone mixed with titanium dioxide.

The light-emitting semiconductor component can be surrounded on its side surfaces by a filler material, for example a silicone material, which can be mixed with titanium dioxide. The top side of the semiconductor component as well as the top side of the filler material can form a flat surface on which the functional layer and the edging can be arranged. The edging can also protrude at least partially into the filler material.

In particular, at least one cover layer may be provided over the functional layer and the edging. The cover layer can be designed to be lightproof. It may therefore be transparent to the light generated. Light emission through the cover layer and thus at the top side of the lighting device can thus be avoided. On the other hand, the cover layer can support an emission at the side surfaces of the lighting device. The edging is preferably made of a transparent material, so that the light can pass through the edging and emerges at a side surface of the lighting device.

The cover layer can be reflective towards the functional layer. Light can therefore be reflected from the cover layer back into the functional layer at the interface between the cover layer and the functional layer. If the functional layer is a conversion layer, this can improve the efficiency of the conversion.

In addition, a reflective cover layer can act as kind of a light guide to prevent light from emerging to the top and to direct the light through the edging, which is at least partially transparent to the light, to a certain extent to the sides. The light can thus emerge at a side surface of the lighting device.

Preferably, the cover layer may have a convex, outwardly bulging curvature on its bottom side facing the functional layer. This allows the cover layer to act as a reflector in an improved way to direct the light towards the side surfaces of the device.

Embodiments also relate to an LED panel comprising:
a carrier device, wherein a plurality of light points are arranged in a matrix-like manner on an upper side of the carrier device, each light spot comprising at least one and preferably exactly one light-emitting semiconductor component which has an light emission area on at least one surface side,
a functional layer above and/or next to the emission areas of the plurality of light points, in particular a conversion layer for converting light of the semiconductor components into light with at least one other wavelength,
a plurality of edgings for the functional layer, each edging having a circumferential border in a circumferential direction, in the center of which a continuous opening is provided,
preferably at least one cover layer over the functional layer and the edgings,
wherein the edgings are arranged or formed at least in the plane of the functional layer in such a way that the center of a respective edging is located at least approximately above a respective light point and the edging surrounds an area of the functional layer above and/or adjacent to the respective light point,
wherein the area of the functional layer at least partially and preferably completely fills the opening of the respective edging.

The optoelectronic illumination device can be considered in particular as a matrix-like arrangement of optoelectronic lighting devices, whereby the optoelectronic lighting devices from the optoelectronic illumination device can be produced by a cutting process. A matrix-like arrangement of optoelectronic lighting devices is especially understood as an array-like arrangement in which the lighting devices are arranged in several columns or rows. Accordingly, a matrix-like arrangement of the light points is understood as an arrangement in which the light points are arranged in several columns or rows.

The edgings can divide the functional layer into individual areas in a matrix-like manner according to the matrix-like arrangement of the light points, wherein for each area the center of a respective edging is at least approximately above a respective light point and the edging surrounds the area of the functional layer above and/or adjacent to the respective light point. The areas of the functional layer can in particular be arranged in the openings of the edgings, wherein adjacent areas of the functional layer are separated from each other by a border surrounding a respective area.

Embodiments further relate to a method of manufacturing at least one optoelectronic lighting device or an optoelectronic illumination device, in particular a lighting device or an optoelectronic illumination device, wherein in the method:
a carrier device is provided, wherein a plurality of light points are arranged in a matrix-like manner on an upper side of the carrier device, each light point comprising at least one and preferably exactly one light-emitting semiconductor component which has a light emission area on at least one surface side, a functional layer, in particular a conversion layer for converting light of the semiconductor components into light with at least one other wavelength, and a plurality of edgings are provided in a layer plane above and/or adjacent to the emission areas of the plurality of light points, at least one cover layer is preferably provided over the functional layer and the edgings, wherein each edging of the plurality of edgings has a surrounding border in a circumferential direction, in the center of which a continuous opening is provided, wherein the edgings are arranged or formed in such a way that the center of the border of a respective edging is located at least approximately above a respective light point and the edgings divide the functional layer into individual areas above and/or adjacent to the light points.

According to a preferred embodiment of the method, first the plurality of edgings is arranged or formed in the layer plane intended for the functional layer and only then the functional layer is formed, in particular in the openings of the edgings.

Conversely, the functional layer can also be formed first and then the plurality of edgings is arranged or formed in the layer plane of the functional layer, especially by pressing the plurality of edgings into the functional layer.

Preferably, the plurality of edgings is formed in a lattice structure, especially made of a transparent material. The lattice structure can be made of a solid material. The lattice structure can thus be pressed into the functional layer, especially as long as the functional layer has not hardened.

The plurality of edgings can be formed by applying a flowable material, especially a viscous material. The plurality of edgings can be formed, for example comparable to a dam, by means of a dispensing process. After curing of the flowable material, the functional layer can be formed in the intermediate areas of the edgings. In particular, it may be intended that the light points of the plurality of light points are separated. When separating the light points, it is preferable to ensure that a separation in the layer plane of the functional layer does not take place in the functional layer, but only in the edgings. The edgings are thus located on the outer surfaces of a separated light point and thus on the outer surfaces of an optoelectronic lighting device formed by the separation. Thus, it can be achieved that the functional layer of a single optoelectronic lighting device lies within an edging. The functional layer can thus be protected by the surrounding edging against environmental influences.

BRIEF DESCRIPTION OF THE DRAWINGS

In the following, embodiments of the invention are explained in more detail with reference to the attached figures.

DETAILED DESCRIPTION OF ILLUSTRATIVE EMBODIMENTS

Figure 1:
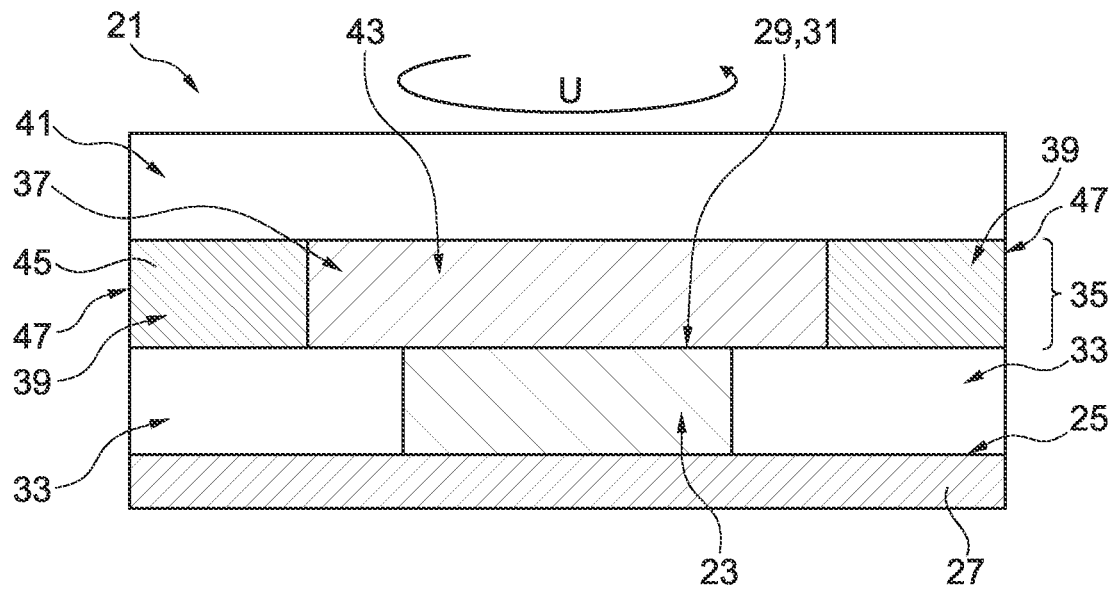
FIG. 1 shows a cross-sectional view of a first embodiment of an optoelectronic lighting device.

The optoelectronic lighting device 21 shown in FIG. 1 comprises a light-emitting and optoelectronic semiconductor component 23 in the form of an LED or LED chip, the bottom side of which is arranged on the upper side 25 of a carrier 27. The semiconductor component 23 has a light emission area 31 on its top surface side 29.

A filling layer 33 is arranged on the side next to semiconductor component 23, which is formed, for example, from silicon mixed with titanium dioxide. In the example shown in FIG. 1, the filling layer 33 and the top surface side 29 form a flat surface. In the above arranged layer plane 35, a functional layer 37 is arranged above the emission area 31 of semiconductor component 23. The functional layer 37 can be a conversion layer, which is particularly suitable for the conversion of light emerging from the emission area 31 into light with at least one other wavelength. Such a conversion layer can, for example, comprise a phosphor embedded in a matrix.

In the lighting device 21, an edging 39 is also provided for the functional layer 37. The edging 39 surrounds the functional layer 37 in a circumferential direction U that extends around the functional layer 37 parallel to the upper side of the carrier 25. As the illustration in FIG. 1 shows, the edging 39 is located laterally above the emission area 31 of the semiconductor component 23, so that the edging 39 has at least essentially no negative effect on the emission properties of the semiconductor component 23. The edging 39 rests on the lateral filling layer 33 and, together with the functional layer 37, forms a flat upper surface on which a cover layer 41 is arranged. The cover layer 41 can, for example, be made of a silicone material mixed with titanium dioxide.

The edging 39 can be made of a transparent material which comprises or consist of silicone and/or glass.

The edging 39 can, for example, be arranged in the form of a solid body on the top side of the filling layer 33 after the formation of the filling layer 33. The functional layer 37 can then be formed in the central opening 43 enclosed by the edging 39. Alternatively, the edging 39 can be formed from a viscous material, similar to a dam, for example by means of a dispensing process, on the top side of the filling layer 33. After the viscous material has cured, the functional layer 37 can then be formed in the opening 43 enclosed by the material.

As can be seen in FIG. 1, the edging 39 comprises a circumferential U-shaped border 45, which in the embodiment shown for example comprises a rectangular cross-section and in the center of which the aforementioned continuous opening 43 is arranged. The border 45 can also have a square, polygonal or circular cross-section when seen in a plane in the circumferential direction U. Other cross-sectional shapes are also possible.

As can be further seen from FIG. 1, the edging 39 or the border 45 has an outer surface 47 facing away from the opening 43 and located on a side surface of the lighting device 21. The side surfaces of the lighting device 21 are those outer surfaces that are perpendicular to the upper side of the carrier 25 and extend upwards.

In the embodiment shown in FIG. 1, the outer surface 47 is thus located on an outer surface of the lighting device, whereas the functional layer 37 is located inside the edging 39. The filling layer 33 is thus protected from environmental influences. Aging processes caused by moisture, for example, can thus be avoided or at least reduced at filling layer 33.

The cover layer 41 can be designed to be opaque so that light cannot emerge upwards through the cover layer 41. The edging 39, on the other hand, can be of a transparent material so that the light can be emitted outwards through one of the outer surfaces 47.

The cover layer 41 can be reflective towards the functional layer 37. Light can be reflected back into functional layer 37 at the interface between the cover layer 41 and the functional layer 37. If functional layer 37 is a conversion layer, this can improve the efficiency of the conversion.

The reflective cover layer 41 can act as a kind of light guide. The same can apply to the filling layer 33. The light reflected back and forth between cover layer 41 and filling layer 33 can be directed to the outer surfaces 47 in an improved manner.

Figure 2:
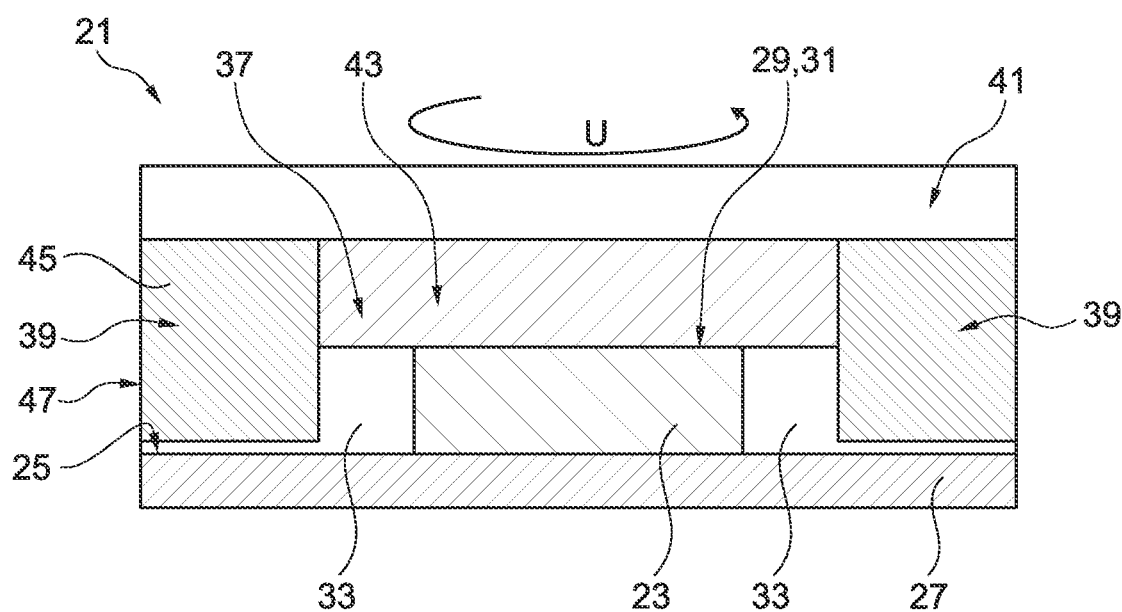
FIG. 2 shows a cross-sectional view of a second embodiment of an optoelectronic lighting device.

The second embodiment of an optoelectronic lighting device 21 shown in FIG. 2 differs from the embodiment shown in FIG. 1 in that the border 45 protrudes into the filling layer 33. In a modification, the bottom side of the border 45 can also rest on the upper side of the carrier 25. The edging 39 can thus form a kind of stop edge for the filling layer 33.

For example, to produce the lighting device shown in FIG. 2, the filling layer 33 can be formed first, and then the edging 39, which is made of a solid and preferably transparent material, can be pressed into the filling layer 33 from above. According to another example, the edging 39 can first be applied to the upper side of the carrier 25, and then the opening 43 of the edging 39 can be filled with the filling layer 33, especially in such a way that the filling layer 33 and the upper surface side 29 of the LED 23 form a flat surface. On this surface, the functional layer 37 can be formed as shown in FIG. 2.

Figure 3:
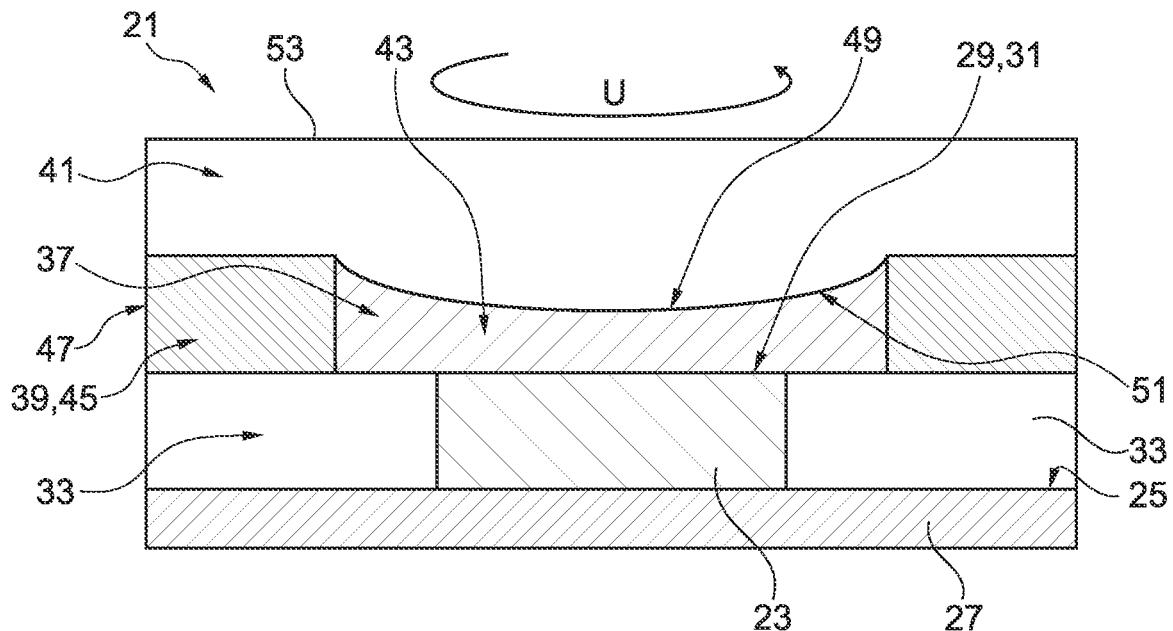
FIG. 3 shows a cross-sectional view of a third embodiment of an optoelectronic lighting device.

The third embodiment of an optoelectronic lighting device 21 as shown in FIG. 3 differs from the embodiment in FIG. 1 in particular in that the top side of the functional layer 37 is not flat, but has a recess 49 in the middle of the top side. The recess 49 can be designed in such a way that the top side of the functional layer 37 comprises a concave curvature. Accordingly, the bottom side of the cover layer 41 above it comprises a convex curvature. The interface between the functional layer 37 and the cover layer 41 can act as kind of a reflector for the light reflected on the bottom side of the cover layer 41 and reflect the light outwards to the sides. The light that is emitted upwards on the top side 29 of component 23 can thus be deflected outwards, for example by 90 degrees, and pass through the transparent edging 39 to the outside. In functional layer 37, the light can be converted into light with a different wavelength. The interface can therefore form kind of a reflector 51. The decoupling efficiency of the light generated in the lighting device 21 at the outer surfaces 47 of the edging 39 can thus be improved. The cover layer 41 can also be impermeable to light, while the edging 39 is transparent. In addition, the bottom side of the cover layer 41 facing the functional layer 37 can be designed as a reflector. The bottom side can be mirrored, for example.

The fourth embodiment of a lighting device 21 in accordance with the present invention according to FIG. 4 differs from the embodiment according to FIG. 3 in particular in that a further, so-called intermediate layer 55 is provided below the cover layer 41. The intermediate layer 55 can be a transparent layer, for example. The intermediate layer 55 can also be regarded as a further cover layer above the functional layer 37. As mentioned above in reference to FIG. 1 for top layer 41, it may also be opaque and reflective towards functional layer 37. This allows for an exclusive light extraction at an outer surface 47.

Figure 4:
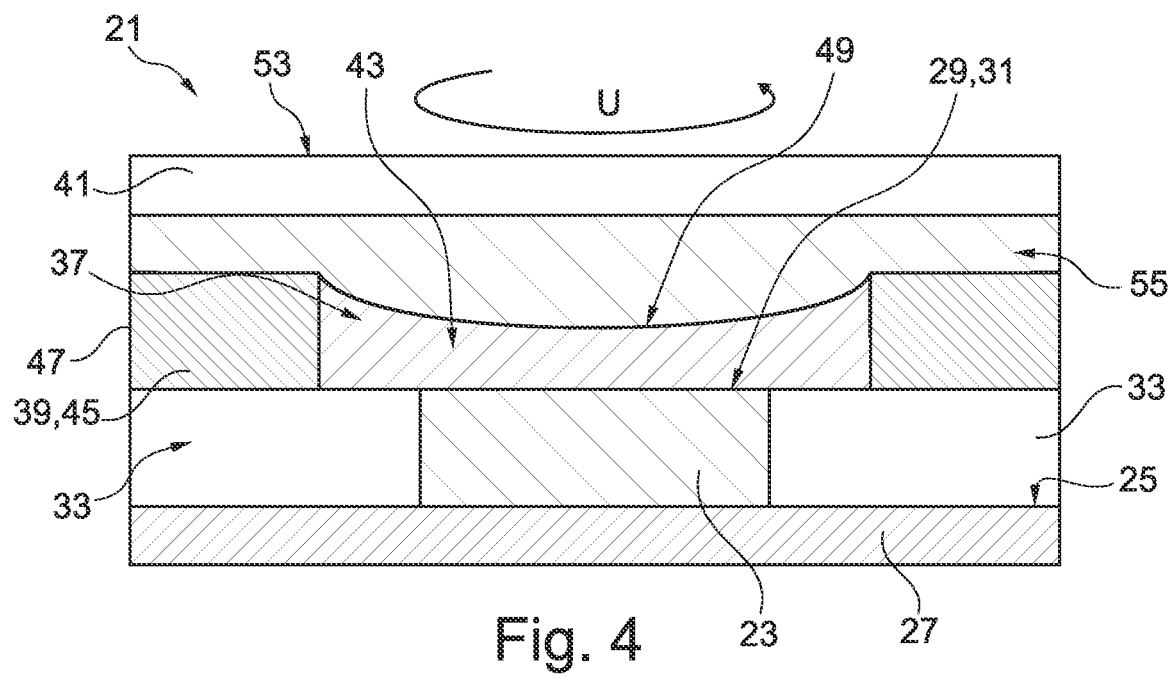
FIG. 4 shows a cross-sectional view of a fourth embodiment of an optoelectronic lighting device.
Figure 5:
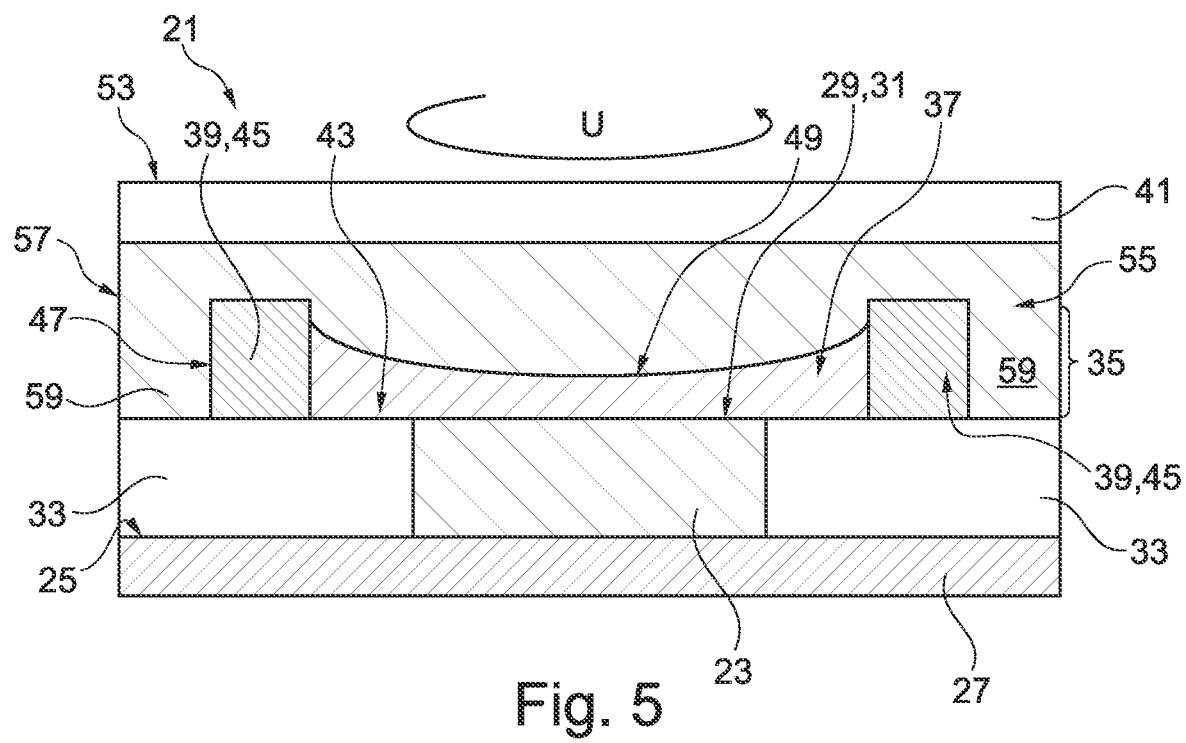
FIG. 5 shows a cross-sectional view of a fifth embodiment of an optoelectronic lighting device.

The fifth embodiment of an optoelectronic lighting device 21 according to FIG. 5 differs from the embodiment according to FIG. 4 in that the outer surface 47 of the border 45 of the edging 39 is not located on an outer side surface of the lighting device 21, but that an edge layer 59 is formed between the outer surface 47 and a side surface 57 of the lighting device 21. In the example shown, the edge layer 59 is formed by the overlying intermediate layer 55, which extends in the layer plane 35 of the functional layer 37 as shown in FIG. 5 between the outer surface 47 of the border 45 and the side surface 57 of the lighting device 21. The intermediate layer 55 and thus in particular the edge layer 59 can be of a, in particular transparent, encapsulation material.

Figure 6:
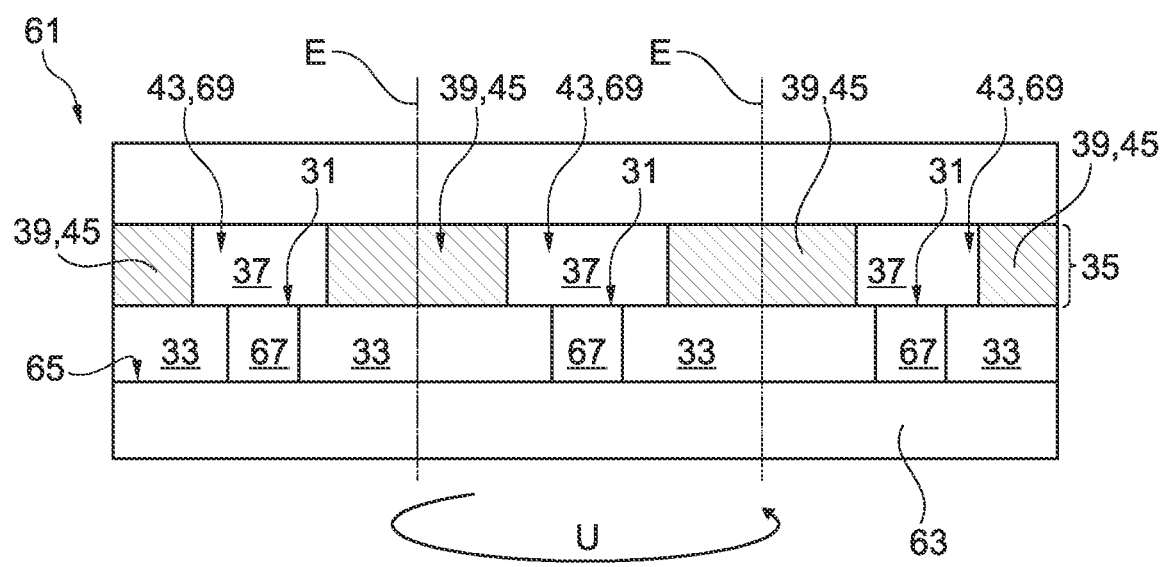
FIG. 6 shows a cross-sectional view of a first embodiment of an optoelectronic illumination device.
Figure 7:
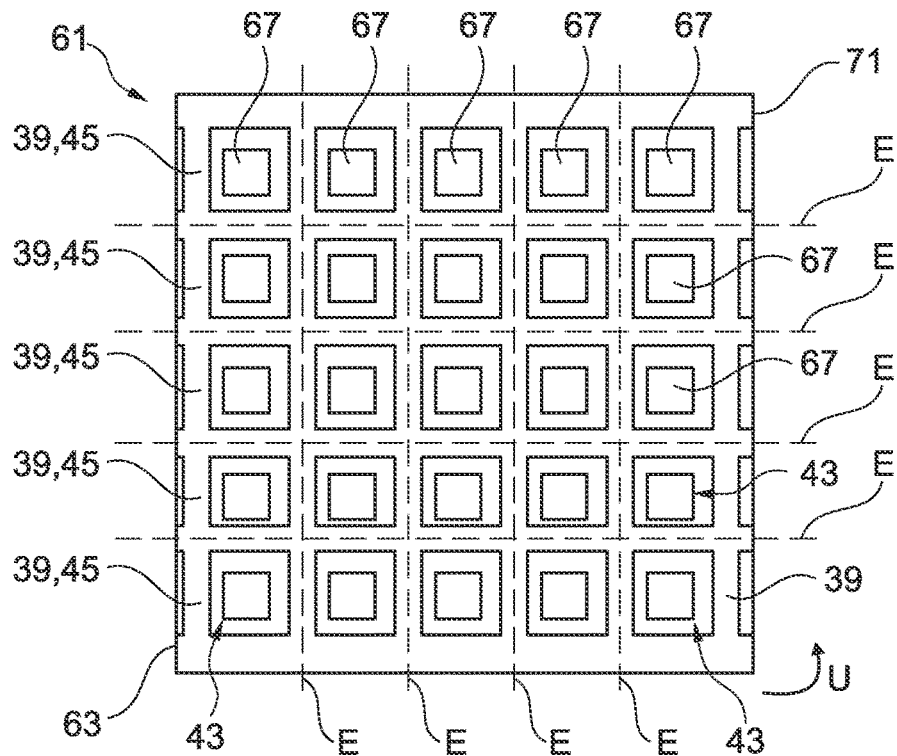
FIG. 7 shows a top view of the optoelectronic illumination device of FIG. 6.

The first embodiment of an optoelectronic illumination device 61, shown in FIG. 6 in cross-section and in FIG. 7 in top view, comprises a carrier device 63, on the upper side 65 of which a plurality of light points 67 are arranged in a matrix-like manner. Each light point 67 comprises at least one light-emitting semiconductor component, compare semiconductor component 23 in FIGS. 1 to 5. A filling layer 33 is formed between the light points 67. A functional layer 37 is arranged above the emission areas of the at least one semiconductor component of a light point 67, which is in particular a conversion layer for converting light from the semiconductor components into light with at least one other wavelength. Furthermore, a plurality of edgings 39 is provided at least in the layer plane 35 of the functional layer 37. Each edging 39 has a surrounding border 45 extending in a circumferential direction U, in the middle of which a continuous opening 43 is provided. The edgings 39 are arranged at least in the plane of the functional layer 35 in such a way that the center of a respective edging is located at least approximately above a respective light point 67 and the edging 39 surrounds an area of the functional layer 37 above the respective light point 67, wherein the area of the functional layer 37 fills the opening 43 of the respective edging 39.

The edgings 39 thus divide the functional layer 37 into individual regions 69 in accordance with the matrix-like arrangement of the light points 67, wherein for each region 69 the center of a respective edging 39 is located at least approximately above the respective light point 67 and the border 45 surrounds the region 69 of the functional layer 37 above the respective light point 67.

From the illuminating device 61 according to FIGS. 6 and 7, several lighting devices 21 according to FIG. 1 can be produced by a cutting process. In this process, the carrier device 63 and the layers above it are separated in separating planes E running perpendicular to the upper side 65 of the carrier device 63. These separating planes E extend at least essentially centrally through the edgings 39 or the borders 45. This ensures that the outer surfaces 47 of the borders 45 of the individual lighting devices 21 lie on the side surfaces of the individual lighting devices 21, as shown in FIG. 1. The functional layer 37 of a single lighting device 21 can thus be protected from ambient influences by the surrounding edging 39.

A cut along the planes E can be made, for example, by means of sawing processes in which water cooling can be used. The edging 39 protects the functional layer 37 of the lighting devices 21 during the sawing process, for example, from moisture caused by the water cooling. Since a sawing process is not performed directly on the material of the functional layer 37, no mechanical damage is caused to the functional layer 37.

Figure 8:
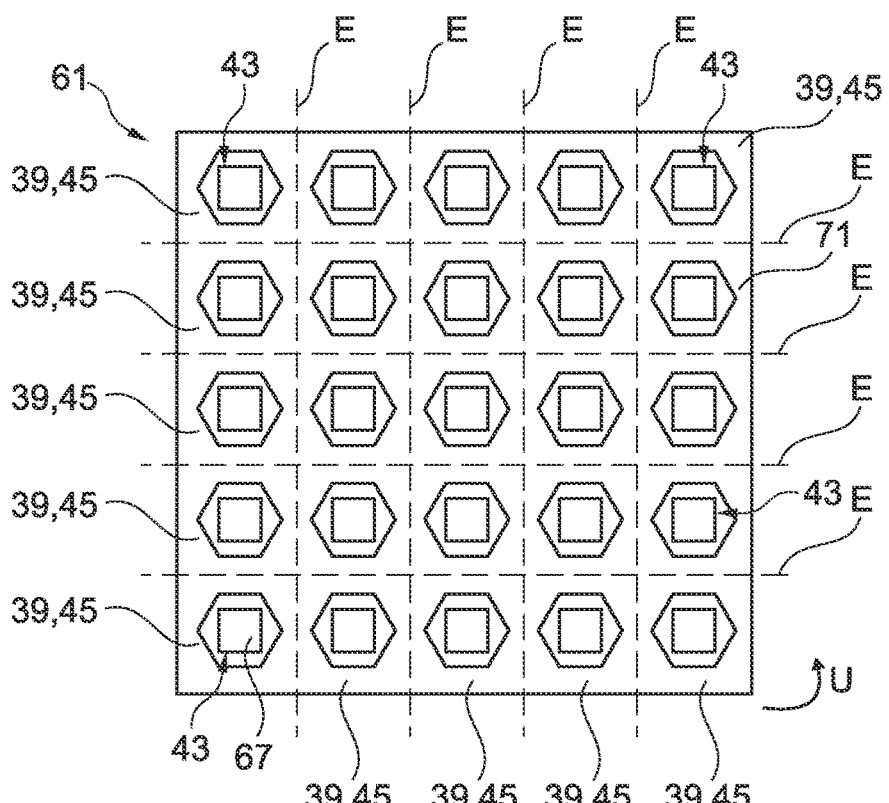
FIG. 8 shows a top view of a second embodiment of an optoelectronic illumination device.
Figure 9:
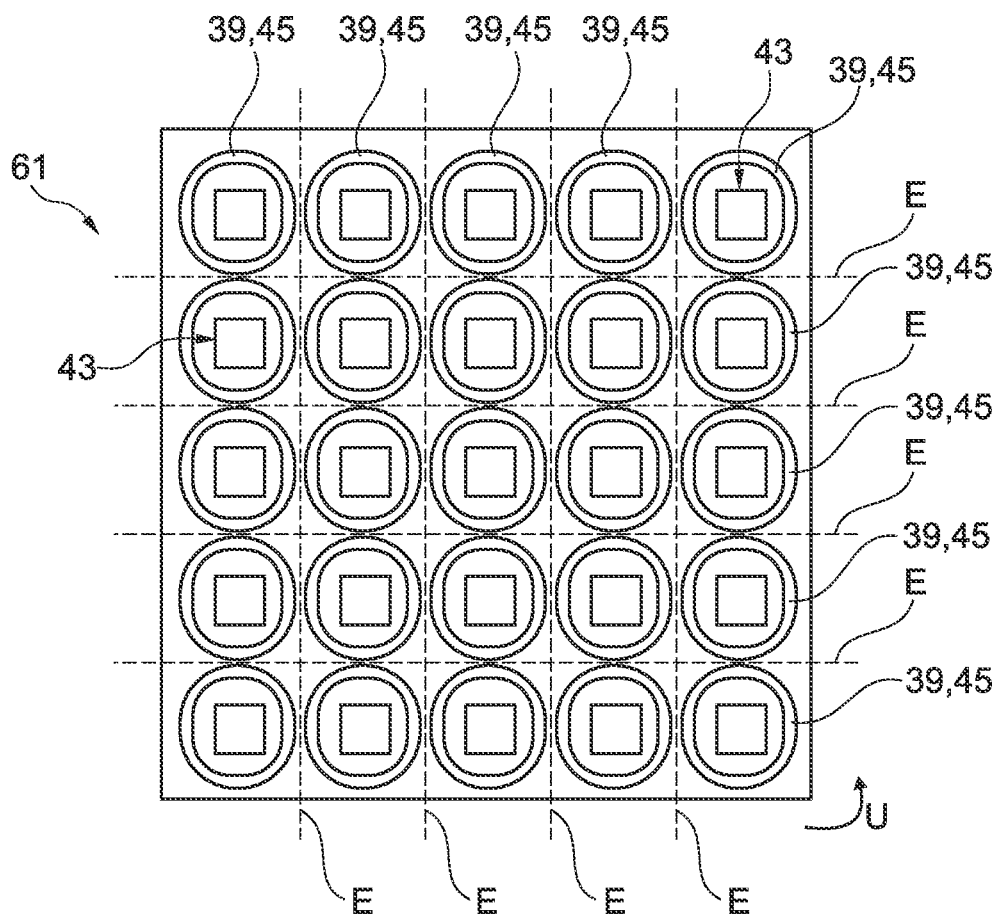
FIG. 9 shows a top view of a third embodiment of an optoelectronic illumination device.

The illumination devices 61 of FIGS. 8 and 9 are built up similarly to the illumination devices of FIGS. 6 and 7. However, for the illumination devices 61 of FIG. 8 the openings 43 of the borders 45 do not comprise a square cross-section, but a hexagonal cross-section, especially with sides of at least substantially equal length. In the embodiment in FIG. 8, the edgings 39 and the borders 45 respectively are connected, as in the embodiment according to FIGS. 6 and 7. During a cutting process and corresponding cuttings along the planes E, adjacent edgings 39 are cut through.

As shown in FIGS. 7 and 8, the contiguous edgings 39 form a kind of lattice structure 71, which can, for example, be designed as a solid, particularly transparent body. The lattice structure 71 can be placed on the top of the filling layer 33 or partially pressed into it during the manufacture of the illumination device 61 (see the embodiment according to FIG. 2).

In case of the illumination device 61 as shown in FIG. 9, the edgings 39 are separated from each other. The border 45 of each edging 39 comprises an at least approximately circular cross-section. The borders 45 can be formed individually, for example by a dispensing process in which the edgings 39 or the borders 45 are formed by applying a viscous material which hardens.

The separation can again be achieved by cutting at the separating planes E. With reference to layer plane 35 (see FIG. 6), a cut is made in the area of the interfaces between the edgings 39. These interfaces can be filled with an edge layer, see edge layer 59 in FIG. 5. By separating, the illumination device 61 in FIG. 9 lighting devices as shown in FIG. 5 can be formed.

Figure 10:
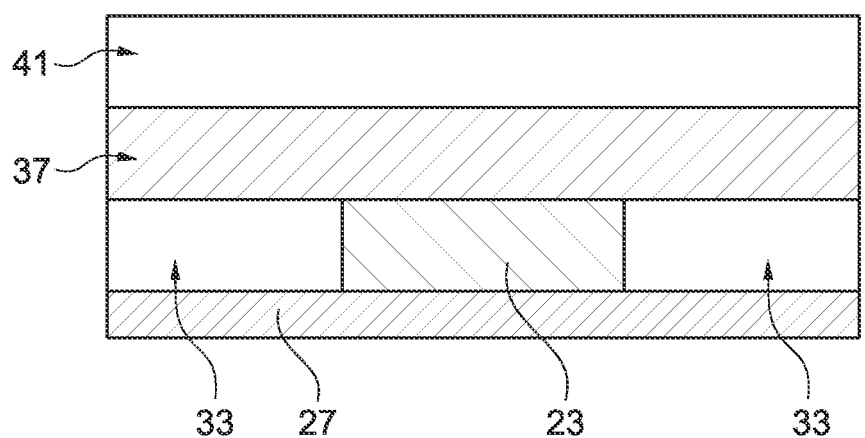
FIG. 10 shows a cross-sectional view of a non-inventive embodiment of an optoelectronic lighting device.

The non-inventive embodiment of an optoelectronic lighting device shown in FIG. 10, in contrast to the lighting devices according to FIGS. 1 to 5, has no edging 39. The functional layer 37 thus extends to the outer side surfaces of the lighting device. Influences from the environment can thus have a direct effect on functional layer 37 and possibly accelerate an aging process.

The invention claimed is:

1. An optoelectronic lighting device comprising:
a carrier;
at least one light-emitting optoelectronic semiconductor component arranged on an upper side of the carrier and comprising a light emission area on a surface side facing away from the carrier and a side surface perpendicular to the carrier;
a filling layer arranged on the upper side of the carrier and adjacent to the side surface of the semiconductor component in plan view;
at least one functional layer arranged on the light emission area and/or adjacent to the light emission area;
an intermediate layer arranged on the functional layer;
an edging surrounding the functional layer in plan view, wherein the edging comprises a transparent material; and
at least one cover layer arranged above the intermediate layer and the edging.

2. The optoelectronic lighting device according to claim 1, wherein the edging surrounds the functional layer such that the functional layer is completely arranged within the edging when viewed in a direction parallel to the upper side of the carrier.

3. The optoelectronic lighting device according to claim 1,
wherein the edging comprises a surrounding border, in a center of which a continuous opening is provided, and
wherein the edging surrounds the functional layer such that the center of the border is arranged above the light emission area of the semiconductor component and/or above the center of the semiconductor component and the functional layer is at least partially arranged the opening.

4. The optoelectronic lighting device according to claim 1,
wherein a border of the edging has at least one outer surface arranged on a side surface of the lighting device, and
wherein the side surface and/or the outer surface of the border extend at least substantially perpendicular to the upper side of the carrier.

5. The optoelectronic lighting device according to claim 1, wherein at least one outer surface of a border of the edging does not lie on a side surface of the lighting device but at least one edge layer is formed between the outer surface and the side surface.

6. The optoelectronic lighting device according to claim 1, wherein the edging has a refractive index which is between a refractive index of the functional layer and a refractive index of air.

7. The optoelectronic lighting device according to claim 1, wherein the edging is formed of a material comprising silicone or glass.

8. The optoelectronic lighting device according to claim 1, wherein the functional layer is formed flat on its top side opposite to the upper side of the carrier or has a recess in the middle of the top side.

9. The optoelectronic lighting device according to claim 1, wherein the cover layer is opaque and/or reflective with respect to the functional layer.

10. An optoelectronic lighting device comprising:
a carrier;
at least one light-emitting optoelectronic semiconductor component arranged on an upper side of the carrier and comprising a light emission area on a surface side facing away from the carrier;
a filling layer arranged on the upper side of the carrier;
at least one functional layer arranged on the light emission area and/or adjacent to the light emission area;
an intermediate layer arranged on the functional layer;
an edging surrounding the functional layer in plan view; and
at least one cover layer is arranged above the intermediate layer and the edging.

11. The optoelectronic lighting device according to claim 10, wherein the edging surrounds the functional layer such that the functional layer is completely arranged within the edging when viewed in a direction parallel to the upper side of the carrier.

12. The optoelectronic lighting device according to claim 10,
wherein the edging comprises a surrounding border, in a center of which a continuous opening is provided, and
wherein the edging surrounds the functional layer such that the center of the border is arranged above the light emission area of the semiconductor component and/or above the center of the semiconductor component and the functional layer is at least partially arranged the opening.

13. The optoelectronic lighting device according to claim 10,
wherein a border of the edging has at least one outer surface arranged on a side surface of the lighting device, and
wherein the side surface and/or the outer surface of the border extend at least substantially perpendicular to the upper side of the carrier.

14. The optoelectronic lighting device according to claim 10, wherein at least one outer surface of a border of the edging does not lie on a side surface of the lighting device but at least one edge layer is formed between the outer surface and the side surface.

15. The optoelectronic lighting device according to claim 10, wherein the edging has a refractive index which is between a refractive index of the functional layer and a refractive index and air.

16. The optoelectronic lighting device according to claim 10, wherein the edging is formed of a material comprising silicone or glass.

17. The optoelectronic lighting device according to claim 10, wherein the functional layer is formed flat on its top side opposite to the upper side of the carrier or has a recess in the middle of the top side.

18. The optoelectronic lighting device according to claim 10, wherein the cover layer is opaque and/or reflective with respect to the functional layer.

* * * * *